United States Patent [19]

Runaldue et al.

[11] Patent Number: 6,094,436
[45] Date of Patent: Jul. 25, 2000

[54] INTEGRATED MULTIPORT SWITCH HAVING SHARED MEDIA ACCESS CONTROL CIRCUITRY

[75] Inventors: Thomas J. Runaldue, San Jose; Somnath Viswanath, Sunnyvale; Peter Ka-Fai Chow, San Jose, all of Calif.

[73] Assignee: Advanced Micro Devices, Inc., Sunnyvale, Calif.

[21] Appl. No.: 08/992,921

[22] Filed: Dec. 18, 1997

Related U.S. Application Data

[60] Provisional application No. 60/038,025, Feb. 14, 1997.

[51] Int. Cl.[7] .................................................. H04B 7/212
[52] U.S. Cl. ........................................... 370/420; 370/463
[58] Field of Search .................................... 370/363, 366, 370/401, 420, 442, 452, 463, 470, 515; 395/200.02

[56] References Cited

U.S. PATENT DOCUMENTS

| | | | |
|---|---|---|---|
| 5,359,602 | 10/1994 | Diaz et al. ............................... | 370/401 |
| 5,467,351 | 11/1995 | Baumert . | |
| 5,515,376 | 5/1996 | Murthy et al. . | |
| 5,790,786 | 8/1998 | Wakeman et al. .................. | 395/200.02 |
| 5,864,554 | 1/1999 | Rostoker et al. ........................ | 370/395 |

FOREIGN PATENT DOCUMENTS

| | | |
|---|---|---|
| 0 603 443 A1 | 6/1994 | European Pat. Off. . |
| 0 603 444 A1 | 6/1994 | European Pat. Off. . |
| 0 656 711 A2 | 6/1995 | European Pat. Off. . |
| WO 91/18462 | 11/1991 | WIPO . |

OTHER PUBLICATIONS

Clark, B. "Emerging LAN Structures" Wescon '94, Sep. 27, 1994, Institute of Electrical and Electronics Engineers, pp. 8–15, XP000532557.

Barilovits, S. et al, "100VG–Any LAN: Network Operation and Real–Time Capabilities", Proceedings of the Conference on Local Computer Networks, Oct. 2, 1994, pp. 120–128, XP00618590.

Albrecht, A. et al., "An Overview of IEEE 802.12 Demand Priority", Proceedings of the Global Telecommunications Conference (Globecom), vol. 1, Nov. 28, 1994, Institute of Electrical and Electronics Engineers, pp. 263–268, XP00048855.

Watson, G. et al. "The Demand Priority MAC Protocol", IEEE Network: The Magazine of Computer Communications, vol. 9, No. 1, Jan. 1, 1995, pp. 28–34, XP000486556.

*Primary Examiner*—Jason Chan
*Assistant Examiner*—Alexander Boakye

[57] ABSTRACT

An integrated multiport switch (IMS) in which one combinational logic and register arrangement is provided for executing similar media access control (MAC) functions for a plurality of switch ports. The current access state at each of a plurality of switch ports is maintained at a single state storage location, whereby access of a stored port MAC state and update thereof is simplified. Access to state storage in coordination with the single common combinational logic and register arrangement enables MAC functions for each of the plurality of ports to be performed on a time shared basis to maximize efficiency of use of chip resources and architecture space.

12 Claims, 6 Drawing Sheets

INTEGRATED MULTIPORT SWITCH HAVING SHARED MEDIA ACCESS CONTROL CIRCUITRY

RELATED APPLICATIONS

This application claims priority from provisional patent application Ser. No. 60/038,025, filed Feb. 14, 1997, the entire disclosure of which is hereby incorporated by reference herein.

TECHNICAL FIELD

The present invention relates to network switching and, more particularly, to shared multiport media access control on a data network switch logic chip.

BACKGROUND ART

A data network switch permits data communication among a plurality of media stations in a local area network. Data frames, or packets, are transferred between stations by means of data network switch media access control (MAC) enabling network interface cards or circuitry at each switch port. The MAC supervises transmission of data traffic from the port to the network, the reception of data traffic at the port from the network, and mediates data traffic at the port to avoid collisions. The network switch passes data frames received from a transmitting station to a destination station based on the header information in the received data frame. Transmit and receiver buffers at each port are coupled to the MAC. Depending upon mode of operation, an incoming packet, temporarily held in a port receive buffer, may be moved to memory external to the switch for later transmission or placed in the transmit buffer of the appropriate port for immediate transmission out to the network.

Packet transmission events typically are tracked to provide a basis for statistical analysis of network operation with respect to each data network switch port. For example, the number of transmitted packets, received packets, transmission collisions and the like can be counted and polled periodically. Through the use of statistical counters, determination can be made of improper device operation such as, for example, loss of packets. Typically, each MAC unit may include a receive state machine and a transmit state machine having internal counters of limited capacity for counting a small number of transmission event parameters for each frame that traverses the respective switch port. Flip-flops, dedicated to the particular parameters, are respectively incremented each time an item in that frame is identified. For each incoming frame, which may be temporarily stored in a receive FIFO buffer, the respective flip-flops in the receive state machine are read and the resulting data are appended to the frame. For outgoing frames, similar processing takes place. Thus, the outgoing frame, transitionally stored in a transmit FIFO buffer, contains appended data relating to the receipt operation and transmit operation. The transmit operation data is added when the frame is transmitted out from the transmit FIFO buffer.

As data networks become more robust and data traffic increases, additional operational parameters become significant. Tracking a greater number of parameters requires increased MAC complexity involving, for example, the provision of more registers and supporting logic elements, as well as larger buffer capacities. Integration of these additional elements for each MAC on the switch logic chip places a burden on chip architecture. As switch development evolves greater traffic flow capacities and the number of switch ports increase, efficient use of chip architecture becomes even more critical.

DISCLOSURE OF THE INVENTION

The present invention addresses the above noted needs and drawbacks in part by recognizing that certain MAC functions for each port are capable of execution by circuitry that need not be provided individually at each port in the conventional manner. An advantage of the invention is that one combinational logic and register arrangement is provided for executing similar functions for a plurality of switch ports. This advantage is based in part in the appreciation that, if the functionality of common circuitry at any given time can be accurately associated with the respective port, then discrete provision of similar circuitry at each port becomes redundant and unnecessary.

A further advantage of the present invention is that the current access state at each of a plurality of switch ports is maintained at a single state storage location, whereby access of a stored port MAC state and update thereof is simplified. Yet another advantage of the present invention is that access to state storage in coordination with the single common combinational logic and register arrangement enables MAC functions for each of the plurality of ports to be performed on a time shared basis. The invention thus provides more efficient use of chip resources and architecture space than prior art conventional devices.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

Reference is made to the attached drawings, wherein elements having the same reference numeral designations represent like elements throughout and wherein:

FIGS. 2, 2A and 2B are block diagrams of a multiport switch, related to the present invention, that may be used in the packet switched system of FIG. 1.

BEST MODE FOR CARRYING OUT THE INVENTION

Figure 1:
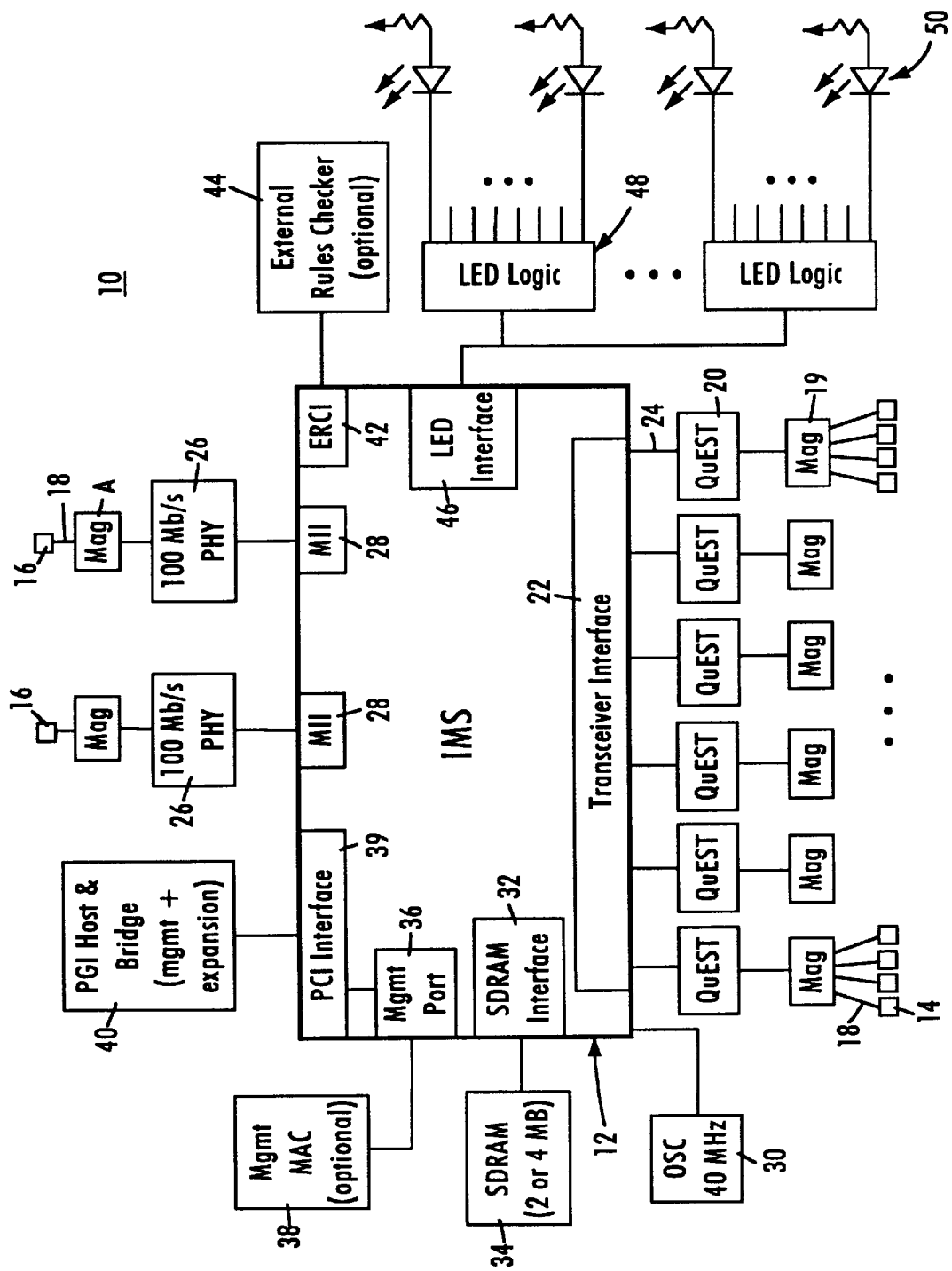
FIG. 1 is a block diagram of a packet switched system environment of the present invention.

The present invention is exemplified herein in a packet switched network environment, such as an Ethernet (IEEE 802.3) network. From the following detailed description it should be apparent that the present invention is also applicable to other packet switched systems. FIG. 1 is a block diagram of a packet switched system 10 which provides the environment of the present invention. The packet switched network includes an integrated multiport switch (IMS) 12 that enables communication of data packets between network stations. The network stations may have different configurations. In the current example, twenty-four (24) 10 megabit per second (Mb/s) network stations 14 send and receive data at a network data rate of 10 Mb/s, and two 100 Mb/s network stations 16 send and receive data packets at a network speed of 100 Mb/s. The multiport switch 12 selectively forwards data packets received from the network stations 14 or 16 to the appropriate destination, based upon Ethernet protocol.

The 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control Working Draft (0.3). The full-duplex environment provides a two-way, point-to-point communication link between each 100 Mb/s network station 16 and the multiport switch 12, so that the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20, labelled QuEST, that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. In the disclosed exemplified embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets among the Ethernet ports serving the network stations 14 and 16. The multiport switch 12 also includes enhanced functionality to make intelligent switching decisions, and to provide statistical network information in the form of management information base (MIB) objects to an external management entity, as described below. Additional interfaces are provided to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

A management port 36 enables an external management entity to control overall operations of the multiport switch 12 by via management MAC interface 38. PCI interface 39 enables access by the management entity via a PCI host and bridge 40. Alternatively, the PCI host and bridge 40 may serve as an expansion bus for a plurality of IMS devices.

An internal decision making engine within switch 12 selectively transmits data packets received from one source to at least one destination station. In lieu of the internal decision making engine, an external rules checker may be utilized. External rules checker interface (ERCI) 42 allows use of an external rules checker 44 to make frame forwarding decisions in substitution for the internal decision making engine. Hence, frame forwarding decisions can be made either by the internal switching engine or the external rules checker 44.

LED interface 46 clocks out the status of conditions per port and drives LED external logic 48. The LED external logic 48, in turn, drives LED display elements 50 that are human readable. An oscillator 30 provides a 40 MHz clock input for the system functions of the multiport switch 12.

Figure 2A:
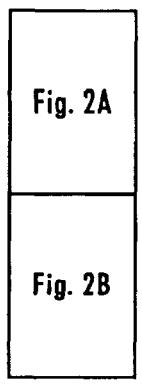
Figure 2A:
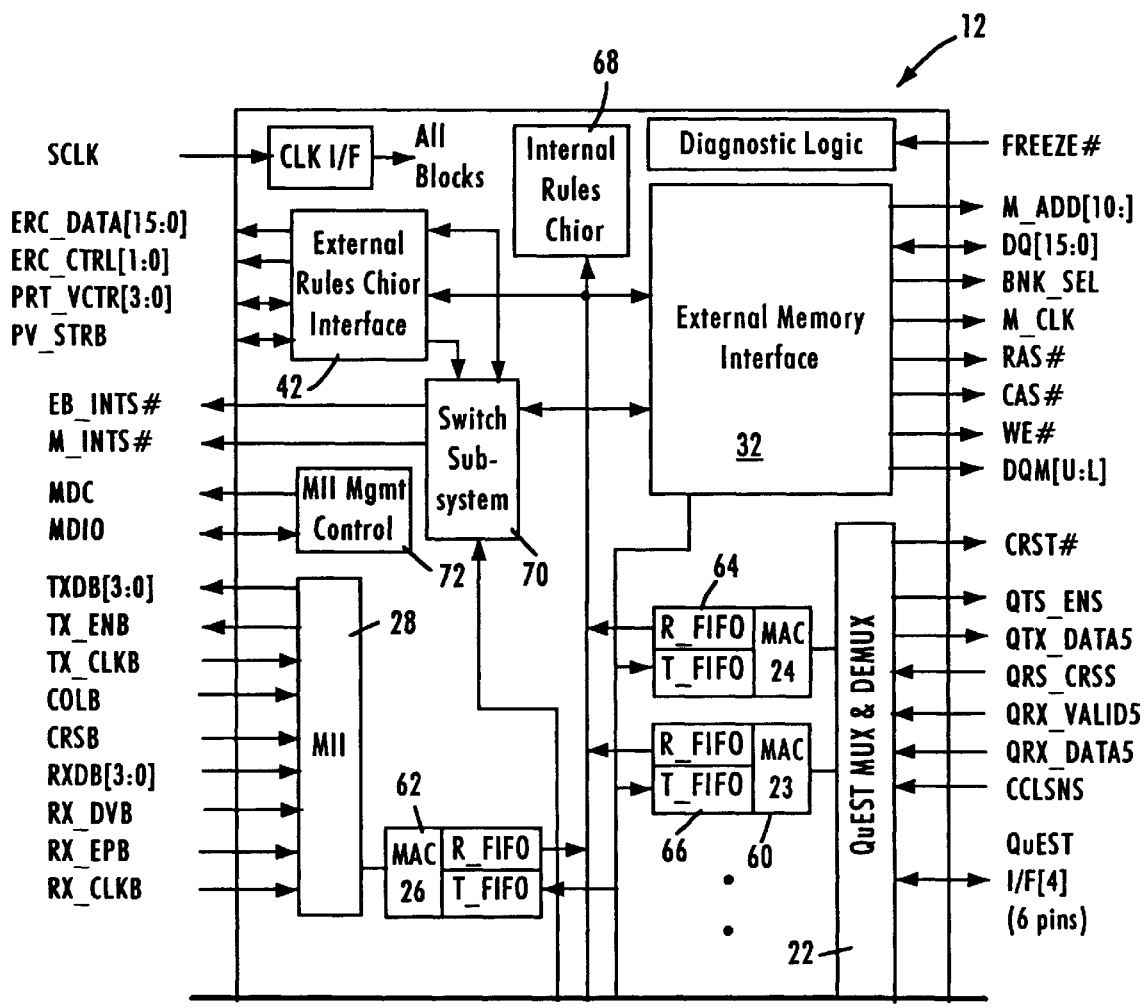
Figure 2B:
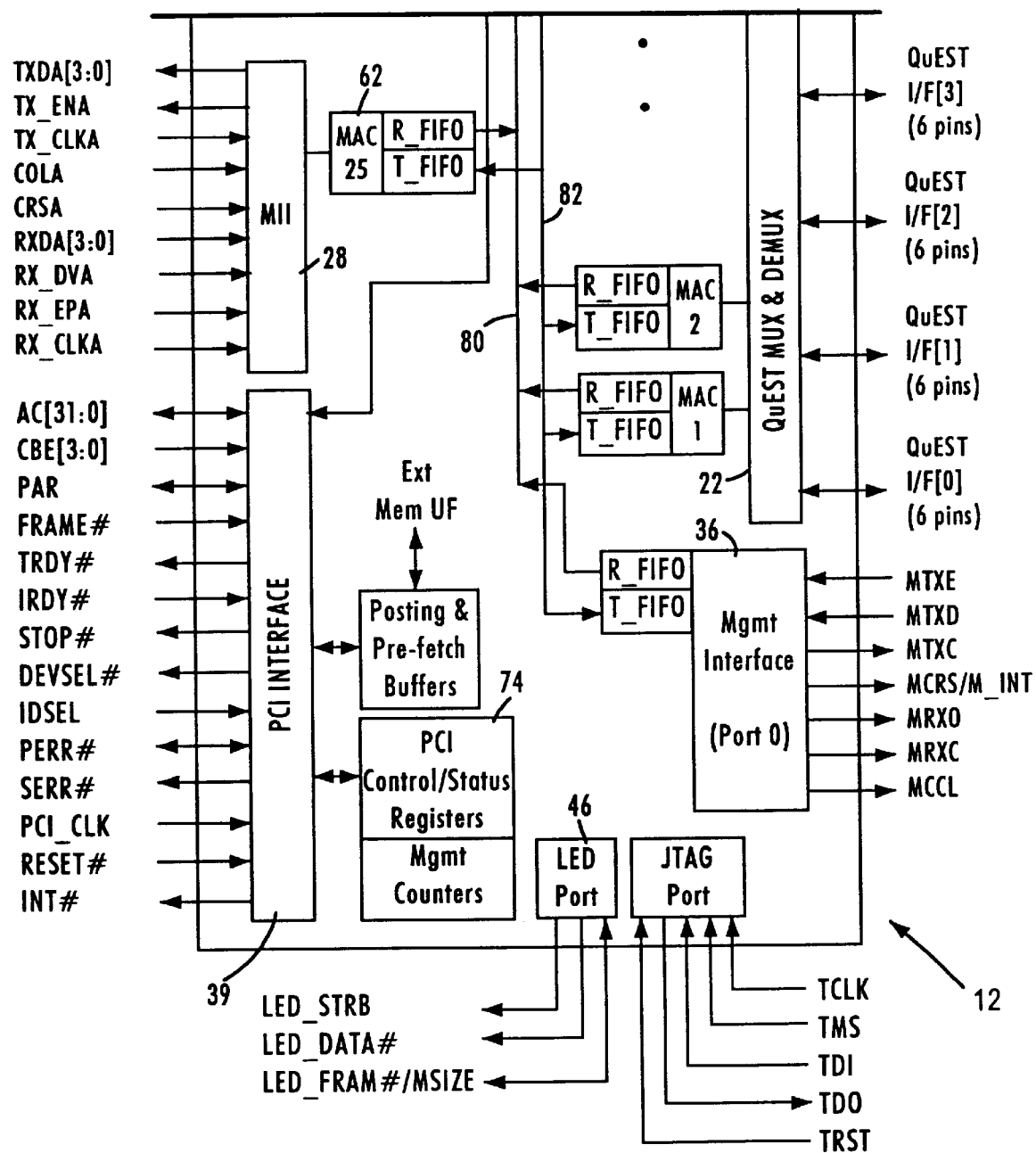

FIG. 2 is a more detailed block diagram of a multiport switch, related to the present invention, that may be used in the packet switched system of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0).

Each of the MAC ports 60, 62 and 36 contains conventional logic and register access control circuitry that enables control of data transmission, data reception, and collision mediation at the port. A receive first-in-first-out (FIFO) buffer 64 and a transmit FIFO buffer 66 are also provided at each port. External memory interface 32 is connected by one common bus to each of the MAC receive FIFO buffers and by another common bus to each of the MAC transmit FIFO buffers.

Data packets from a network station are received by the corresponding MAC port and stored in the corresponding receive FIFO buffer 64. The received data packet is output from the corresponding receive FIFO buffer 64 to the external memory interface 32 for storage in the external memory 34.

The header of the received packet is also forwarded to a decision making engine, comprising an internal rules checker 68 and an external rules checker interface 42, to determine which MAC ports will output the data packet. Whether the packet header is forwarded to internal rules checker 68 or external rules checker interface 42 is dependent on the operational configuration of multiport switch 12. Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The internal rules checker 68 and external rules checker 44 provide the decision making logic for determining the destination MAC port for a given data packet. The decision making engine may indicate that a given data packet is to be output to either a single port, multiple ports, or all ports (i.e., broadcast). Each data packet includes a header having source and destination address, in accordance with which the decision making engine can identify the appropriate output MAC port(s). The destination address may correspond to a virtual address, in which case the decision making engine identifies output ports for a plurality of network stations. Alternatively, a received data packet may include a VLAN (virtual LAN) tagged frame according to IEEE 802.1d protocol that specifies another network (via a router at one of the 100 Mb/s stations 16) or a prescribed group of stations. Hence, the internal rules checker 68 or the external rules checker 44 via the interface 42 will decide whether a frame temporarily stored in the buffer memory 34 should be output to a single MAC port or multiple MAC ports.

The decision making engine outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information, as exemplified by the following elements. A management data interface 72 enables the multiport switch 12 to exchange control and status information with the switch transceivers 20 and the 100 Mb/s physical devices 26 according to the MII management specification (IEEE 802.3u). The management data interface 72 also outputs a management data clock (MDC) providing a timing reference on the bidirectional management data IO (MDIO) signal path. The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 3:
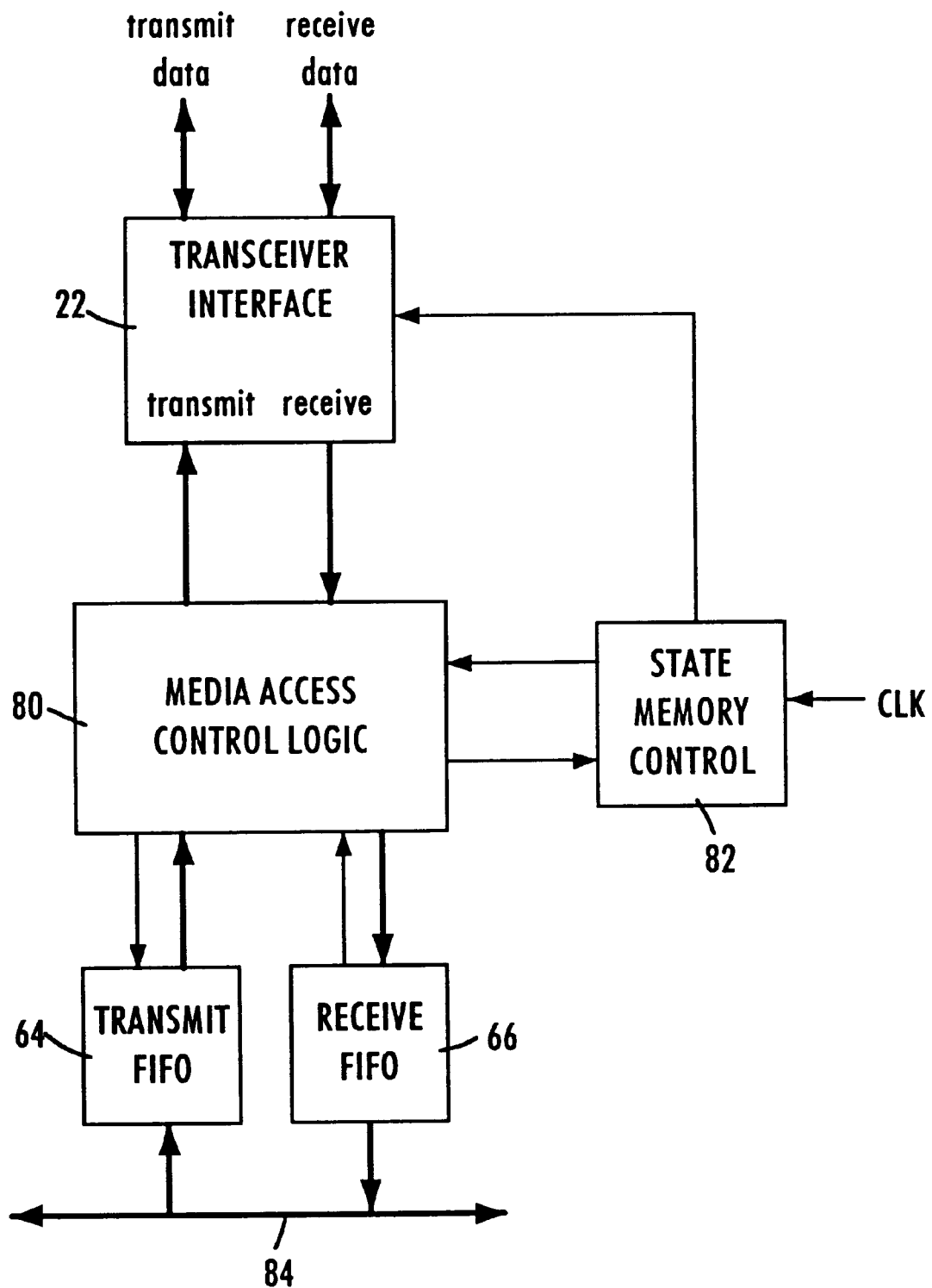
FIG. 3 is a block diagram illustrating media access control in accordance with the present invention.

FIG. 3 is a block diagram illustrating media access control for the system of FIG. 1 in accordance with the present invention. In contrast to the arrangement shown in FIG. 2, a single media access control logic unit 80 is provided to be used in common for the twenty-four (24) 10 Mb/s switch ports 60 and the management port. Unit 80 is coupled to transceiver interface 22 by means of a transmit connection and a receive connection. The unit 80 is also connected to the transmit FIFO 64 and the receive FIFO 66 at each port 60. It is to be understood that, while only a single port FIFO pair is shown for ease of illustration, the corresponding FIFOs of all ports 60 are represented. FIFO 64 and FIFO 66 are connected to bus 84. While shown as a single line, bus 84 represents a common receive bus connection among all port 60 receive FIFOs and the external memory interface 32, as well as a common transmit bus connection among all port 60 transmit FIFOs and external memory interface 32.

A state memory control unit 82 stores the media access state of each of ports 60. Unit 82 is connected to unit media access control logic unit 80 for transfer of state data therebetween. A data communication also exists between the state memory control unit 82 and transceiver interface 22. State memory control unit 82 has a clock input for receiving an 80 Mhz signal. As to be more fully described below, this clock signal provides synchronization timing for time shared media access control functionality performed by logic unit 80 for each of the twenty four switch ports 60.

Figure 4:
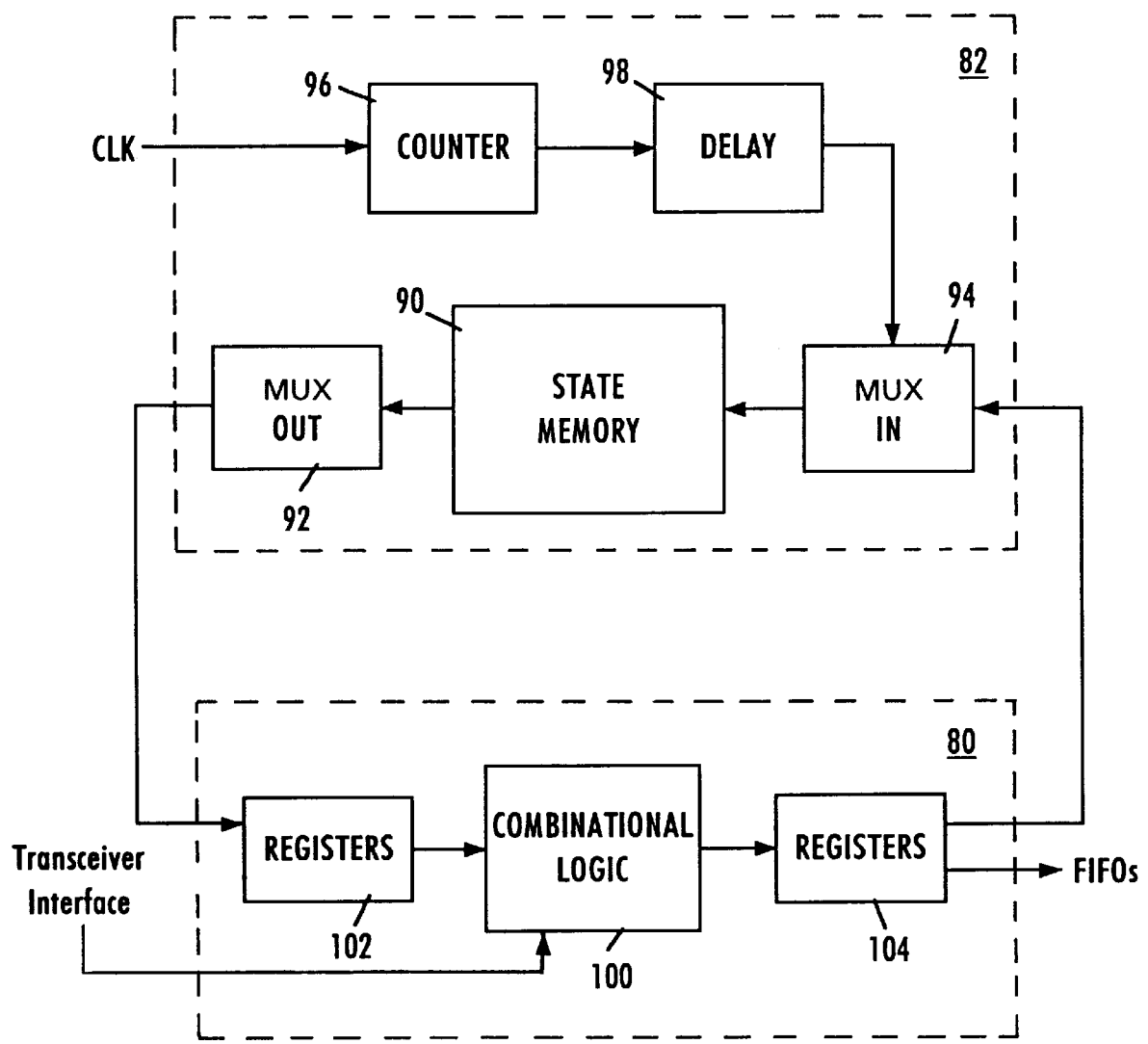
FIG. 4 is a more detailed block diagram of a preferred configuration of the media access control logic unit 80 and the state memory control unit 82 in the present invention.

FIG. 4 is a more detailed block diagram of a preferred configuration of the media access control logic unit 80 and the state memory control unit 82 of FIG. 3. State memory control unit 82 comprises state memory 90, output MUX 92, input MUX 94, counter 96 and delay circuit 98. State memory 90, which stores the access states at each of the ports 60, may be embodied, for example, by a random access memory (RAM) or by one or more registers dedicated to each port 60. Output MUX 92 and input MUX 94 are connected to state memory 90 respectively to select data from or input data to the state memory. Counter 96, which has an input from the 80 Mhz clock source, outputs a data signal having sufficient bits to uniquely identify each of the ports 60. For the twenty five port embodiment of FIG. 1, the counter output signal preferably is five bits in length. This signal is incremented in value with each received clock signal pulse.

The counter output signal is applied to output MUX 92, thereby to identify the port for which the state memory data is to be accessed from state memory 90. The counter output signal is also applied to delay circuit 98, which holds and delays the signal for a plurality of clock stages. The output of the delay circuit 98 is applied to the input register 94, thereby identifying that port for which data is to be stored in the state memory 90. Thus, the time period between retrieval of stored data for a given port and writing of new data for that port is dependent upon the number of clock stages delayed by the delay circuit 98. Determination of this number is coordinated with the number of clock pipeline stages required by the media access control logic unit 80. The registers, counter and delay circuits are each conventional, well-known elements.

Processing for the media access control functions and access state indication occurs in combinational logic unit 100, which comprises a plurality of logic gates. Registers 102 and the transceiver interference 22 are connected to input data to the logic unit, as acquired from the state output MUX 92 and the transceiver interface 22. After processing the data received from registers 102, the logic unit outputs the processed data to registers 104. This processed data includes instructions to be transmitted to the FIFOs at the associated port, any communication data to be transferred, and the change, if any, of the port access state, the latter being transmitted to the state input MUX 94. The input of data to registers 102, the transfer of data from registers 102 to logic unit 100 for processing, the transfer of processed data from registers 104 to the state input MUX 94, and updating of the state memory 90, occur in sequential clocked pipeline stages.

Figure 5:
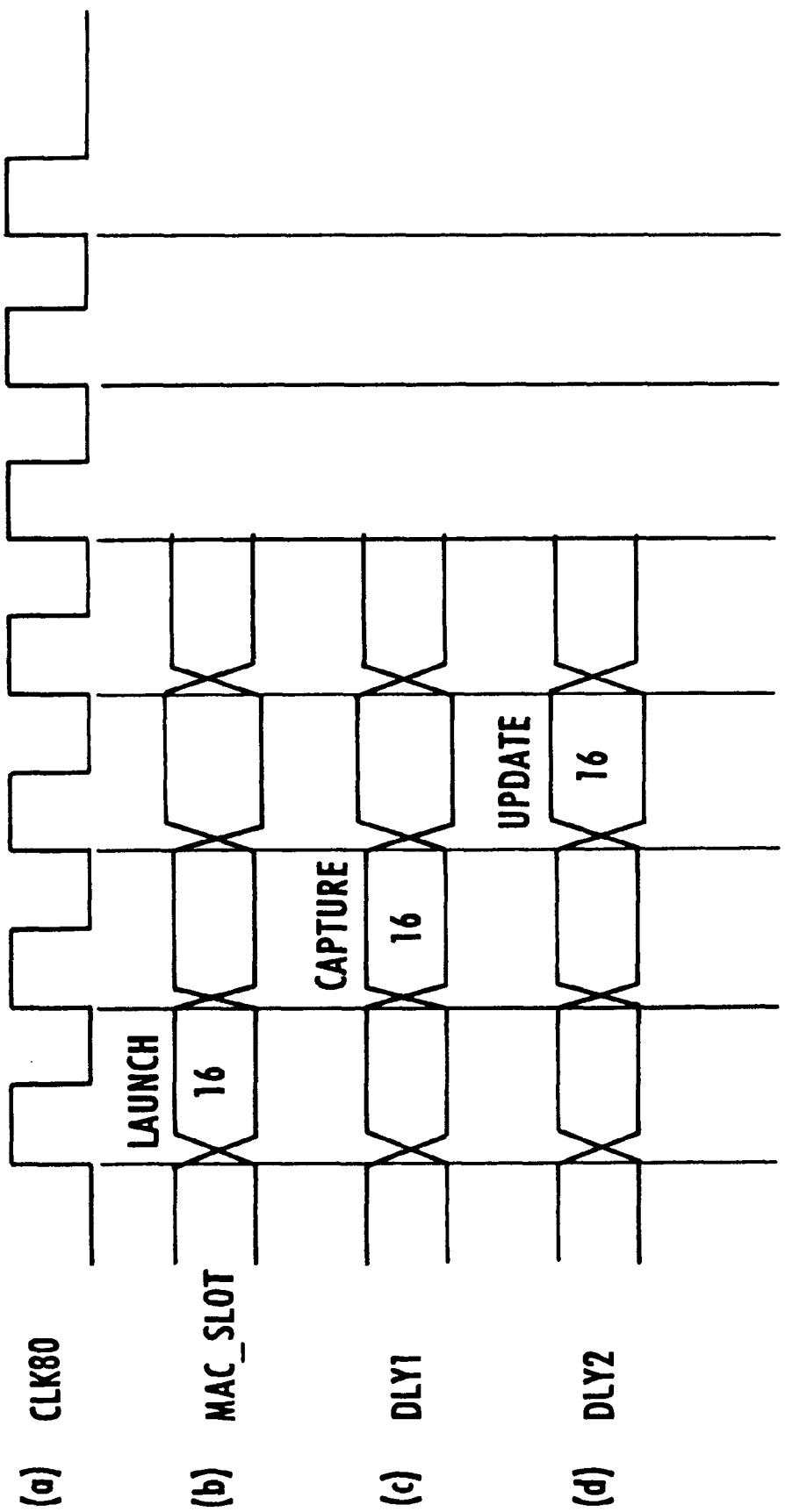
FIG. 5 is waveform diagram depicting staged pipeline operation in accordance with the present invention.

FIG. 5 is waveform diagram depicting the staged pipeline operation. In the preferred embodiment, the delay circuit 98 contains two delay stages. Waveform (a) represents the 80 Mhz clock signal. Waveform (b) represents the output of counter 96 during each cycle of the clock signal of waveform (a). This signal identifies a MAC port and is incremented with each clock signal, thereby to establish sequential time shared operation. Each clock cycle thus defines a "MAC slot" corresponding to a port identified by the counter. For illustration, the MAC slot identified by the counter output during the first clock cycle is slot 16. Waveforms (c) and (d) represent MAC slot identification for two stages of delay during each clock signal cycle. Thus MAC slot 16 is indicated by waveform (c) during the second clock cycle and by waveform (d) during the third clock cycle.

Each of waveforms (b) through (c) is associated with one of three stages of media access control activity (indicated in the figure by the broad labels "launch," "capture" and "update") and thus identifies the MAC port to which that activity relates. The three activities operate concurrently during each clock cycle respectively for different MAC ports. The figure illustrates the three stages of operation for MAC port 16. The launch stage for this port occurs during the first illustrated clock cycle. During this cycle, the counter identifies port 16 for which data is accessed from the state memory 90 through MUX 92 and held in register 102. During the next clock cycle, the capture stage for MAC port 16 takes place. Data from the register 92 and the transceiver interface are then input to and processed by the combinational logic unit 100, the resulting data held in registers 104. Also during this cycle, the counter will have identified the next MAC port for launch stage operation. During the next clock cycle, the update stage for MAC port 16 takes place. State update data from registers 104 are transferred to input MUX 94 and stored in state memory 90. Operational data are transferred to the appropriate FIFO. Media access control continues in this manner sequentially for each MAC port.

The present invention thus advantageously provides efficient media access control while conserving chip architecture. Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. An integrated multiport network switch for interfacing with a data network to permit data communication among a plurality of remote stations coupled to said data network, said switch having a logic chip comprising:

a plurality of ports for transmitting data frames to and receiving data frames from said data network;

media access control (MAC) circuitry for controlling the flow of data frames at each of said ports, said MAC circuitry being coupled in common to each of said ports on a time shared basis, said MAC circuitry comprising logic circuit means for performing media access functions and state memory means for storing media access states of the said plurality of ports;

at least one input receive first-in-first-out (FIFO) buffer at each port for temporarily holding data frames received from the network at the respective port; and at least one transmit FIFO buffer at each port for temporarily holding data frames to be transmitted to the network at the respective port, each said FIFO buffer being coupled to said logic circuit means.

2. An integrated multiport network switch as recited in claim 1, wherein said MAC circuitry is centrally located on said chip.

3. An integrated multiport network switch as recited in claim 1, wherein said media access functions comprise data transmission, data reception and data collision mediation. each said FIFO buffer being coupled to said logic circuit means.

4. An integrated multiport network switch as recited in claim 1, wherein said switch includes a plurality of switch transceivers associated with respective remote network stations and said chip further comprises:

a time division multiplex/demultiplex transceiver interface coupled between said logic circuit means and said plurality of switch transceivers.

5. An integrated multiport network switch as recited in claim 4, wherein at least one of said switch transceivers comprises multiplex/demultiplex means for time sharing data communications for a plurality of said remote stations.

6. An integrated multiport network switch as recited in claim 4, wherein said state memory means comprises:

data storage having portions thereof allocated respectively to data representing the current state of each of said ports;

an output register coupled to said data storage for receiving therefrom stored data representing the state of a first designated one of said ports, said output register being coupled to said logic circuit means for outputting data thereto;

an input register coupled to said logic circuit means for receiving therefrom data representing the state of a second designated one of said ports, said input register coupled to said data storage for inputting data thereto; and access means for accessing said data storage portions in sequential clocked stages.

7. An integrated multiport network switch as recited in claim 6, wherein said data storage portions are identified by switch port addresses and said access means comprises:

a counter responsive to a clock signal and connected to said output register for sequentially supplying thereto a port address for which data is to be retrieved from the corresponding data storage portion; and delay means connected between said counter and said input register for delaying application thereto of the port address supplied by said counter by at least one clock stage;

whereby updated media access state data for the counter supplied port address is received from said logic circuit means and applied to the corresponding data storage portion.

8. An integrated multiport network switch as recited in claim 7, wherein said logic circuit means comprises registers having a first input for receiving data from said output register and a second input for receiving data from said transceiver interface.

9. A method for controlling media access at a plurality of ports of a multiport integrated network switch coupled to a data network to permit data communication among a plurality of remote stations connected to said data network, comprising the steps of:

sequentially reading the access state of each port from a common data storage state memory;

for each said sequential reading step, executing a data communication access function at the corresponding port in response to data received from a transceiver interface coupled to said port; and for each said executing step, updating said common data storage state memory; and wherein said step of sequentially reading comprises addressing said common data storage state memory in response to the output of a clocked counter and said updating step comprises:

delaying said clocked counter output;

addressing said common data storage state memory in response to said delayed clocked counter output; and writing said new state data to the memory at the address in said addressing step; and wherein said executing step comprises processing data read in said reading step and data received from said interface in a logic circuit common to all of said ports; and generating, in said common logic circuit, new state data for said port.

10. A method as recited in claim 9, wherein said step of executing comprises transmitting data stored in a transmit buffer at said port to the data network.

11. A method as recited in claim 9, wherein said step of executing comprises receiving data from said network at a receive buffer at said port.

12. A method as recited in claim 9, wherein said step of executing comprises mediating data collision at said port.

* * * * *